(12) United States Patent  (10) Patent No.: US 7,524,718 B2
Furusawa et al.  (45) Date of Patent: Apr. 28, 2009

(54) METHOD FOR MANUFACTURING PHOTOELECTRIC TRANSDUCER, AND ELECTRONIC APPARATUS

(75) Inventors: Masahiro Furusawa, Chino (JP); Ichio Yudasaka, Chino (JP); Hideki Tanaka, Chino (JP); Tsutomu Miyamoto, Shiojiri (JP); Hideo Shimamura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 381 days.

(21) Appl. No.: 11/374,119

(22) Filed: Mar. 14, 2006

(65) Prior Publication Data

US 2006/0214088 A1  Sep. 28, 2006

(30) Foreign Application Priority Data

Mar. 25, 2005  (JP)  ............... 2005-088852

(51) Int. Cl.
*H01L 21/8238* (2006.01)
(52) U.S. Cl. .................. 438/202; 438/96; 438/48; 257/458
(58) Field of Classification Search .......... 438/48, 438/96, 202; 257/458
See application file for complete search history.

(56) References Cited

U.S. PATENT DOCUMENTS

| | | | |
|---|---|---|---|
| 4,855,795 A * | 8/1989 | Yamamoto et al. ........... 257/53 |
| 5,132,248 A * | 7/1992 | Drummond et al. ......... 505/325 |
| 6,518,087 B1 | 2/2003 | Furusawa et al. | |
| 6,759,268 B2 * | 7/2004 | Akagawa ................. 438/106 |
| 6,808,972 B2 * | 10/2004 | Sirringhaus et al. ......... 438/200 |

FOREIGN PATENT DOCUMENTS

| | | |
|---|---|---|
| JP | A-2001-284274 | 10/2001 |
| JP | A-2002-87809 | 3/2002 |
| JP | A-2003-313299 | 11/2003 |
| WO | WO 00/59044 | 10/2000 |

\* cited by examiner

*Primary Examiner*—Thanh V Pham
*Assistant Examiner*—Caleb Henry
(74) *Attorney, Agent, or Firm*—Oliff & Berridge, PLC

(57) ABSTRACT

A method for manufacturing a photoelectric transducer, comprising: forming a first electrode on a substrate; forming a first conductivity-type semiconductor layer on the first electrode; forming an I type semiconductor layer on the first conductivity-type semiconductor layer; forming on the I type semiconductor layer a second conductivity-type semiconductor layer that is different from the first conductivity-type; and forming a second electrode on the second conductivity-type semiconductor layer, wherein the forming of the I type semiconductor layer includes: forming a precursor film of the I type semiconductor layer on the first conductivity-type semiconductor layer by arranging droplets containing a silicon compound in an island shape; and converting the precursor film into the I type semiconductor layer by carrying out heat treatment or photoirradiation treatment to the precursor film.

13 Claims, 7 Drawing Sheets

METHOD FOR MANUFACTURING PHOTOELECTRIC TRANSDUCER, AND ELECTRONIC APPARATUS

BACKGROUND

1. Technical Field

The present invention relates to a method for manufacturing a photoelectric transducer using a liquid containing a silicon compound, and to an electronic apparatus provided with the photoelectric transducer manufactured with this method.

2. Related Art

Conventionally, as an environment-friendly power supply, photoelectric transducers such as a solar battery have been attracting the attention, and single crystal silicon type solar batteries used for satellite batteries or the like, and solar batteries using polycrystal silicon or amorphous silicon are widely used for industries and homes.

The amorphous-silicon solar battery typically has a structure, the so-called PIN structure, in which a first conductivity-type semiconductor layer and a second conductivity-type semiconductor layer (e.g., a P type semiconductor layer and an N type semiconductor layer) sandwich a light absorption layer composed of an I type semiconductor layer, and photo-current and photo electromotive force are taken out from electrodes using the internal electric field generated in an I type semiconductor layer.

As a method for manufacturing solar batteries at low cost without using large-scale equipments, there has been proposed in the example of the related art a method in which a liquid coating composite containing a silicon compound is applied onto a substrate thereby to form a coated film, and a silicon film, which is formed carrying out heat treatment and/or photo-treatment to this coated film, is used as a semiconductor layer.

International Publication WO 00/59044 is an example of related art.

In the method for applying the liquid coating composite containing a silicon compound onto a substrate, it is known that although 200 through 300 nm thin film can be formed, cracks occur or the film peels off from the substrate when attempting to form a film of the thickness greater than 200 through 300 nm.

However, in the solar batteries of a PIN structure, in order to obtain high photoelectric-conversion efficiency, it is conceived desirable that the thickness of the I layer be on the order of 2 μm. For this reason, the method for applying the coating composite onto a substrate is not suitable, and the forming is usually carried out with a relatively costly method such as CVD.

SUMMARY

An advantage of the invention is to provide a method in which a micron-order I type semiconductor layer required for solar batteries of a PIN structure is manufactured at low cost using a liquid silicon material.

According to an aspect of the invention, a method for manufacturing a photoelectric transducer includes the steps of forming a first electrode on a substrate; forming a first semiconductor layer of a P type or an N type on the first electrode; forming a second semiconductor layer of an I type on the first semiconductor layer; forming a third semiconductor layer of an N type or a P type on the second semiconductor layer; and forming a second electrode on the third semiconductor layer. In the method, when the first semiconductor layer is made to be a P type, the third semiconductor layer is made to be an N type, and when the first semiconductor layer is made to be an N type, the third semiconductor layer is made to be a P type, wherein the step of forming the second semiconductor layer includes the steps of: forming a precursor film of the silicon film on the first semiconductor layer by arranging droplets containing a silicon compound in an island shape; and converting the precursor film into a silicon film by carrying out heat treatment or photoirradiation treatment to the precursor film.

If the liquid containing a silicon compound is arranged as a substantially hemispherical droplet in an island shape on the first semiconductor layer, it is possible to form a film thicker than in the case where the coating film is formed in a wide area with a spin coating method or the like. As for the substantially semi-sphere droplet, although the thickness thereof becomes thin due to the influence that solvent and hydrogen escape in the subsequent heating or photoirradiation step, the micron-order semiconductor thin film can be obtained. In such a semiconductor thin film, cracks hardly occur and the film also hardly peels off from the substrate.

It is preferable to include the step of forming a liquid-repellent film in regions other than the region, in which the droplets containing a silicon compound are to be arranged, in the first semiconductor layer prior to forming the second semiconductor layer.

If a liquid-repellent/lyophilic pattern is formed in the surface of the first semiconductor layer prior to arranging the droplets containing a silicon compound, the droplets will remain in the lyophilic region and will not get wet and not spread to the liquid-repellent region. Consequently, it is possible to arrange more droplets in the lyophilic region and make the thickness of the droplet thicker.

Moreover, it is preferable that the thickness of the silicon film be 1 μm or more after the step of heat treatment or photoirradiation treatment. By setting the film thicknesses of the I type semiconductor layer to 1 μm or more, preferably 2 μm or more, a photoelectric transducer with a high photoelectric-conversion efficiency and high performance can be obtained.

Moreover, it is preferable to adjust the contact angle relative to the liquid-repellent film of the droplets containing a silicon compound as to be 40 through 120 degrees. By controlling the contact angle as to be within this range, the droplets with thickness and an excellent shape can be arranged. In addition, the control of the contact angle can be carried out selecting the type of material of the first semiconductor layer, the type of solvent of the droplets containing a silicon compound, the type of the liquid-repellent film, or the like, suitably. If the contact angle is 40 degrees or less, the sufficient droplets can not be arranged in the lyophilic region, and it becomes difficult to obtain a silicon film with a necessary film thickness. Moreover, if the contact angle is 120 degrees or more, the adhesion force may become weak when forming the third semiconductor layer.

Moreover, it is preferable to further include the step of forming an insulating film in between the silicon films that are formed in an island shape after the heat treatment or photoirradiation treatment step. With such a configuration, it is possible to prevent the P type semiconductor layer and N type semiconductor layer from jointing to each other.

According to another aspect of the invention, the method for manufacturing the photoelectric transducer includes the steps of: forming a first electrode on a substrate; forming a first semiconductor layer on the first electrode; forming a second semiconductor layer of an I type on the first semiconductor layer; forming a third semiconductor layer of an N type or a P type on the second semiconductor layer; and forming a second electrode on the third semiconductor layer. In the method, when the first semiconductor layer is made to be a P type, the third semiconductor layer is made to be an N type, and when the first semiconductor layer is made to be an N type, the third semiconductor layer is made to be a P type, wherein the step of forming the first semiconductor layer includes: a first silicon film forming step in which the precursor film is converted into a silicon film by carrying out heat treatment or photoirradiation treatment after a precursor film of the silicon film is formed on the first semiconductor layer by arranging droplets containing a silicon compound in an island shape; and a second silicon film forming step in which the precursor film is converted into a silicon layer by carrying out heat treatment or photoirradiation treatment after droplets containing a silicon compound are arranged in an island shape to form the precursor film of the silicon film while offsetting the center thereof from that of the silicon film formed in the first silicon film forming step. With such a configuration, it is possible to cover the surface of the first semiconductor layer with substantially semi-sphere droplets containing a silicon compound, and form a photoelectric transducer having a wider area.

Moreover, it is also preferable to further include the step of forming a liquid-repellent film in regions other than the region, in which the droplets containing a silicon compound are to be arranged in the first semiconductor layer prior to the step of forming the first silicon film. As described above, if the liquid-repellent/lyophilic pattern is formed in the surface of the first semiconductor layer prior to arranging the droplets containing a silicon compound, the droplets will remain in the lyophilic region and will not get wet and not spread to the liquid-repellent region. Consequently, it is possible to arrange more droplets in the lyophilic region and make the thickness of the droplets thicker.

Moreover, it is preferable to further include the step of forming a liquid-repellent film on the first semiconductor layer and the silicon film formed in the step of forming the first silicon film, also prior to the step of forming the second silicon film. Accordingly, the droplets arranged on the substrate and on the silicon film, which are formed in the step of forming the first silicon film, will not get wet and not spread, and it becomes easier to take a spherical form and form a thin film having more thickness.

It is also preferable to repeat the step of forming the second silicon film twice or more. Even in the case where the silicon film cannot be formed in the whole surface of the first semiconductor layer by carrying out once, the I type semiconductor layer can be formed in the whole surface by repeating the step twice or more. Moreover, if further repeating the step after having formed the thin film once in the whole surface, the I type semiconductor layer with more thickness can be formed.

It is also preferable to further include the step of forming the liquid-repellent film on the first semiconductor layer and the already-formed silicon film prior to each time of the step of forming the second silicon film which is to be carried out repeatedly twice or more. Accordingly, the droplets containing a silicon compound to be arranged each time will not get wet and not spread, and it becomes easier to take a spherical form and form a thin film with more thickness.

Moreover, it is preferable that the above-described silicon compound include a high order silane compound. The high order silane compound can be arranged as the droplet as it is, or by dissolving it into an organic solvent. Then, it will be converted into a silicon film by baking in an inert-gas atmosphere.

In addition, it is preferable that the droplets containing a silicon compound be arranged with an ink-jet method. With the ink-jet method, it is possible to discharge and arrange microscopic droplets precisely in a desired place.

It is preferable that the substrate to be used in the manufacturing method of the photoelectric transducer concerning the invention be a flexible substrate constituted primarily of resin material. Accordingly, a photoelectric transducer with flexibility can be formed.

Furthermore, the invention provides an electronic apparatus provided with the photoelectric transducer manufactured with the manufacturing method of the photoelectric transducer of the invention. The electronic apparatus concerning the invention is a high-performance apparatus provided with a photoelectric transducer excellent in the photoelectric-conversion efficiency.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Hereinafter, the manufacturing method of the photoelectric transducer of the invention, a photoelectric transducer, and an electronic apparatus will be described in detail based on the suitable embodiments shown in the accompanying drawings.

First Embodiment

Figure 1:
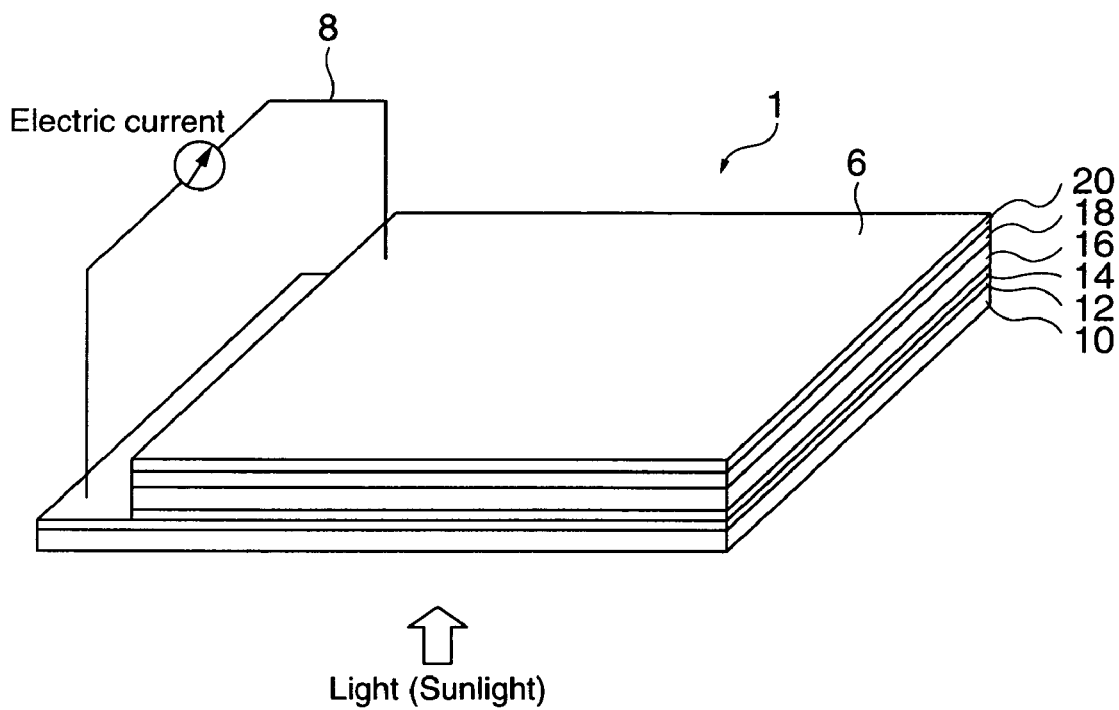
FIG. 1 is a perspective view showing a first embodiment of the photoelectric transducer concerning the invention.

FIG. 1 is a perspective view showing an embodiment of the photoelectric transducer of the invention. In addition, in the following description, on the space of FIG. 1 the upper side is referred to as the "upper" or "top", and the lower side is referred to as the "lower" or "bottom", and the upper side face of each layer (each member) is referred to as the "upper face" and the lower side face is referred to as the "lower face".

A photoelectric transducer 1 shown in FIG. 1 is the so-called dry type photoelectric transducer, which does not require an electrolytic solution. This photoelectric transducer 1 includes a substrate 10, a first electrode (a plate electrode) 12, a P type semiconductor layer 14 as a first semiconductor layer, an I type semiconductor layer 16 as a second semiconductor layer, an N type semiconductor layer 18 as a third semiconductor layer, and a second electrode (an opposing electrode) 20. Hereinafter, the configuration of each layer (each part) is described.

The substrate 10 supports each layer of the first electrode 12, the P type semiconductor layer 14, the I type semiconductor layer 16, the N type semiconductor layer 18, and the second electrode 20. This substrate 10 is composed of a flat plate-like (or layer-like) member.

In the photoelectric transducer 1 of this embodiment, as shown in FIG. 1, from the substrate 10 and the first electrode 12 side, which will be described later, for example, light such as sunlight (hereinafter, simply referred to as "light") is caused to be entered (irradiated) and used. For this reason, it is preferable that the substrate 10 and the first electrode 12 be made to be substantially transparent (transparent and colorless, transparent and color, or half transparent), respectively. Accordingly, light can be caused to reach the I type semiconductor layer 16 efficiently.

The manufacturing step of the photoelectric transducer 1 is shown in FIG. 2.

Step of Forming the First Electrode

Figure 2A:
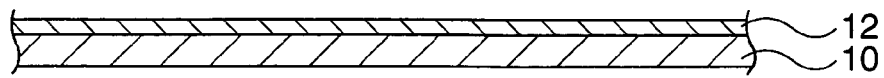
FIG. 2 shows explanatory views showing the manufacturing step of the photoelectric transducer concerning the invention.

First, as shown in FIG. 2A, the first electrode 12 is formed on the substrate 10. As the constituent material of the substrate 10, there are listed, for example, various kinds of glass material, various kinds of ceramic material, polycarbonate (PC), various kinds of resin material such as polyethylene terephthalate (PET), or the like. Moreover, the substrate 10 may be constituted of a laminated body of a monolayer or a plurality of layers. Although the average thickness of the substrate 10 is suitably set depending on the material, applications, or the like and is not restricted in particular, it can be set as follows, for example.

In the case where the substrate 10 is hard rigid, the average thickness thereof is preferably set to be on the order of 0.1 through 1.5 mm, and more preferably on the order of 0.8 through 1.2 mm. Moreover, in the case where the substrate 10 is the one having flexibility (a flexible nature), (a flexible substrate composed primarily of resin material), the average thickness thereof is preferably set to be on the order of 0.5 through 150 μm, and more preferably on the order of 10 through 75 μm.

In addition, in the case where the photoelectric transducer 1 is mounted on various kinds of electronic apparatus, the constituent member of the electronic apparatus can be used as the substrate 10 of the photoelectric transducer 1.

In the upper face of the substrate 10, the first layer-like electrode (a plate electrode) 12 is formed. The constituent material of the first electrode 12 includes, for example, a tin doped indium oxide (ITO), a fluorine doped tin oxide (FTO), an indium oxide (IO), various kinds of metal oxides such as a tin oxide ($SnO_2$) (a transparent electric conductive oxide), aluminum, nickel, cobalt, platinum, silver, gold, copper, molybdenum, titanium, tantalum, or various kinds of metal material such as alloy containing the above, carbon, carbon nano-tube, various kinds of carbon materials such as fullerene, or the like, and one kind or two kinds, or more of these can be combined to be used, and a thin film-like electrode can be formed with a sputtering method, a spray method, a spin coating method, an ink-jet method, or the like.

Although the average thickness of the first substrate 12 is suitably set depending on the material, applications, or the like and is not restricted in particular, it can be set as follows, for example. In the case where the first electrode 12 is constituted of various kinds of metal oxides, the average thickness thereof is preferably set to be on the order of 0.05 through 5 μm, and more preferably on the order of 0.1 through 1.5 μm. Moreover, in the case where the first electrode 12 is constituted of various kinds of metal materials or various kinds of carbon materials, the average thickness thereof is preferably set to be on the order of 0.01 through 1 μm, and more preferably on the order of 0.03 through 0.1 μm.

Step of Forming the P Type Semiconductor Layer

Figure 2B:
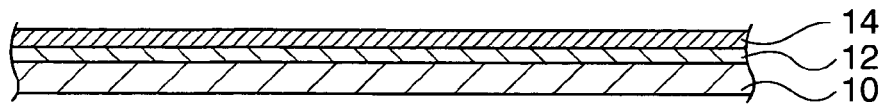

Next, as shown in FIG. 2B, the P type semiconductor layer 14 as the first semiconductor layer is formed on the first electrode 12. The P type semiconductor layer can be formed by: doping a compound containing boron into a liquid-like silicon compound (a silane compound, in particular) having a ring system that is expressed with, for example, the general formula $Si_nX_m$ (here, X denotes a hydrogen atom and/or halogen atom, n denotes an integer of five or more, and m denotes an integer of n, 2n−2, or 2n); irradiating ultraviolet rays thereto to polymerize; thereafter diluting this with solvent such as toluene; and using the liquid material which passed through a filter. The solvent used here is not restricted in particular as long as it dissolves the above-described silane compound and/or the compound containing boron and will not react with the dissolved substance. Moreover, the compound containing boron to be used for the formation of the P type semiconductor layer includes, for example, diborane [$B_2H_6$], tetraborane [$B_4H_{10}$], pentaborane [$B_5H_9$], hexaborane [$B_6H_{10}$], decaborane [$B_{10}H_{14}$], trimethyl boron [$B(CH_3)_3$], and triethyl boron [$B(C_2H_5)_3$] and triphenyl boron [$B(C_6H_5)_3$] or the like, other than the silane compound containing boron atoms.

The above-described liquid material can be applied onto the first electrode 12 using a spin coating method, a roll coating method, a curtain coating method, a dip coating method, a spray method, an ink-jet method, or the like, and it is formed, for example, on the order of several tens of nm in thickness. After this coating, it is baked (for example, at 400° C. for 1 hour) thereby to be a doped amorphous silicon. Crystallization is carried out further with laser irradiation or the like as necessary.

As a specific example, there is listed a method in which a coating solution is prepared diluting 1 mg of decaborane and 1 g of cyclohexa silane into 20 g of toluene, and this solution is spin-coated onto the substrate 10 in an argon atmosphere and dried at 150° C., and then a thermal decomposition is carried out at 450° C. in argon that contains 3% hydrogen, and a P-type amorphous silicon film on the order of 60 nm in film thickness is formed.

Step of Forming the Liquid-Repellent Film

Subsequently, a liquid-repellent film 15 is formed on the P type semiconductor layer 14. The liquid-repellent film can be obtained by forming a liquid-repellent monomolecular film in the whole surface of the P type semiconductor layer 14 first and by removing the unnecessary portion thereafter. The liquid-repellent film can be formed by contacting, to the surface of the substrate 10 and amorphous silicon film 12, a solution containing a compound (for example, silane coupling agent or the like that is expressed with $Y_nSiX_{(4-n)}$ (here, Y denotes an alkyl group, a fluoro alkyl group, a vinyl group, an amino group, a phenyl group, or an epoxy group; X denotes an alkoxyl group or a halogen, and n denotes an integer of 1 through 3)), which has the liquid-repellent organic residue on one end and has, on other end, a functional group capable of coupling to the substrate surface.

Alternatively, it is also preferable to form a monomolecular film using fluoride alkyl silane (FAS). In this case, for example, 100 mg of FAS and the substrate are put in a sealed container and left at room temperature for one day, and then by baking the substrate at 120° C. for 1 hour, FAS monomolecular film is formed in the whole surface of the substrate.

Figure 2C:
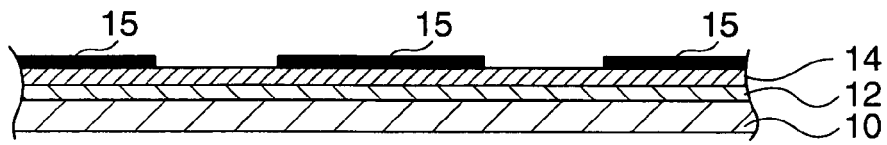

Next, out of this liquid-repellent monomolecular film, the one formed in the region, in which the I type semiconductor layer is to be formed, is removed. This step can be carried out, for example, by irradiating ultraviolet rays through a mask that has an opening in the region in which the liquid-repellent monomolecular film is desired to be removed. In case of FAS, FAS in the irradiated portion can be decomposed and removed by irradiating ultraviolet rays of a wavelength of approximately 172 nm. The state in which the liquid-repellent film 15 is thus formed in the necessary region is shown in FIG. 2C.

Here, in order to obtain a sufficient film thickness as the I type semiconductor layer, the diameter of the droplet containing a silicon compound is preferably 100 μm through 600 μm, and more preferably 200 μm through 400 μm, and it is therefore preferable that the opening of the above-described mask be set to this size.

Step of Forming the Precursor Film of Silicon Film

Figure 2D:
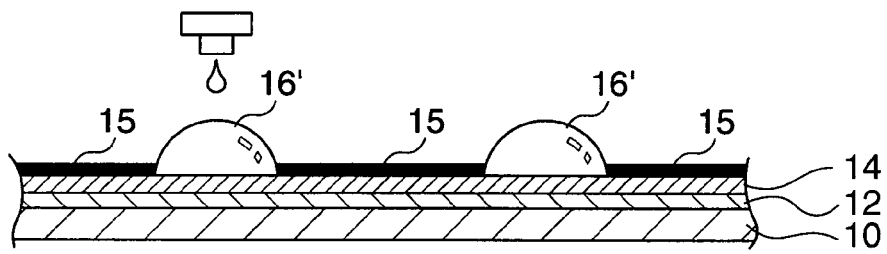

Next, as shown in FIG. 2D, the liquid silicon material which does not contain the dopant source is discharged with an ink-jet method, and the droplets are arranged in the region, namely in the lyophilic portion, in which the liquid-repellent film 15 of the P type semiconductor layer 14 is not being formed, and are dried, thereby forming a precursor film 16' of the silicon film.

As the liquid silicon material, for example, the one, which is made by: irradiating ultraviolet rays to a liquid silicon compound (a silane compound, in particular) having a ring system that is expressed with the general formula $Si_nX_m$ (here, X denotes a hydrogen atom and/or halogen atom, n denotes an integer of five or more, and m denotes an integer of n, 2n−2, or 2n) thereby to polymerize; and diluting this with a toluene solvent as to be approximately 10% and passing this through a filter, can be used.

Figure 3:
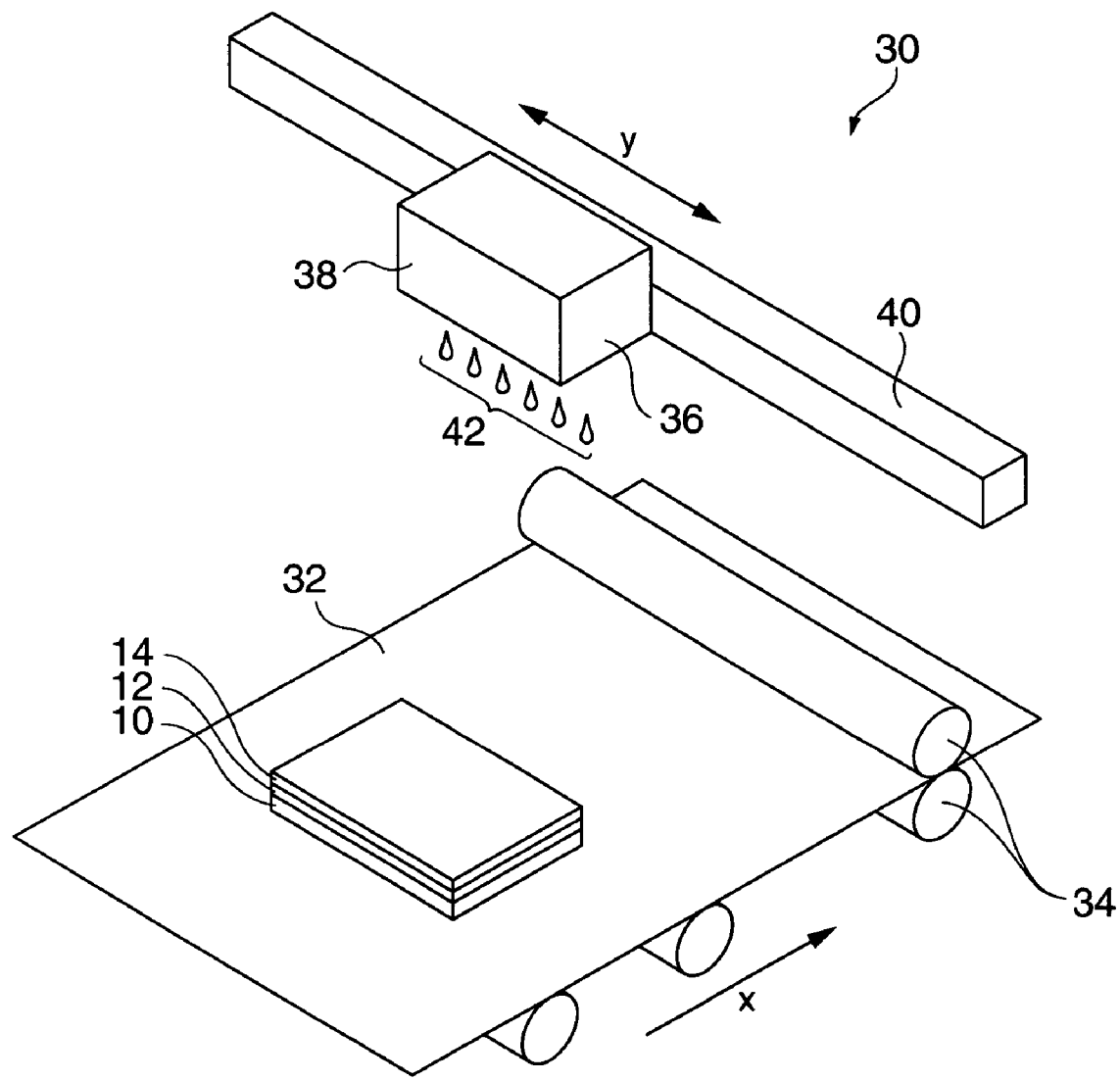
FIG. 3 shows a droplet-discharging equipment used in the manufacturing method of the photoelectric transducer concerning the invention.

Here, an example of the droplet-discharging equipment (ink-jet equipment) used in the ink-jet method is shown in FIG. 3. A droplet-discharging equipment 30 shown in FIG. 3 includes a mounting table 32 to mount the substrate 10, an x-axis drive roller 34 to move (scan) the mounting table 32 in the x-axis direction, a droplet-discharging head 38 having a nozzle 36, and a y-axis driving mechanism 40 to move (feed) the droplet-discharging head 38 in the y-axis direction.

The liquid silicon material is contained in the droplet-discharging head 38 and is discharged, as droplets 42 from small holes formed at the tip of the nozzle 36. The film is formed by discharging the droplets 42 from the small holes of the nozzle 36 while moving the mounting table 32 in the x-axis direction and reciprocating the droplet-discharging head 38 in the y-axis direction. In addition, if the contact angle relative to the liquid-repellent film 15 of the droplets that contain a silicon compound is within the range of 40 through 120 degrees at this time, a thicker silicon film can be formed suitably.

Heat-Treatment Step

Figure 2E:
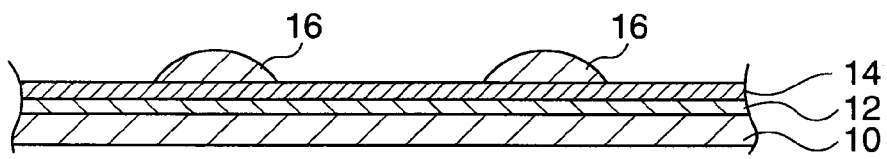

Subsequently, as shown in FIG. 2E, baking at 400° C. for 1 hour is carried out thereby to convert the precursor film 16' of silicon film into an amorphous silicon film (an I type semiconductor layer) 16. The liquid-repellent film 15 is decomposed and removed at this time. The film thickness becomes thin if baked, however, according to the method concerning the invention, the height after the heat treatment of the droplets are formed to be 1 μm or more, preferably 2 μm or more, and more preferably 3 μm or more.

In case of the heat treatment, amorphous silicon film is obtained for the end-point temperature of 550° C. or less, and polycrystal silicon film is obtained for the temperature of 550° C. or more. In the case where the amorphous silicon film is desired to be obtained, preferably 300° C. through 550° C., more preferably 350° C. through 450° C. is used. When the end-point temperature is 300° C. or less, the thermal decomposition of the silane compound may not proceed sufficiently and the silicon film with sufficient characteristics may not be able to be formed. As for the atmosphere in carrying out the above-described heat treatment, an inert gas such as nitrogen, helium or argon, or the atmosphere, in which a reducing gas such as hydrogen is mixed, is preferable. In the case where the polycrystal silicon film is desired to be obtained, it is possible to convert into the polycrystal silicon film by irradiating laser to the amorphous silicon film obtained as described above. It is preferable that the atmosphere at the time of irradiating the above-described laser be an inert gas such as nitrogen, helium or argon, or the atmosphere, in which the reducing gas such as hydrogen is mixed into these inert gases, the atmosphere not containing oxygen. In addition, if laser such as an excimer laser is irradiated in place of the heat treatment, the polycrystal silicon film can be obtained. Moreover, crystallization may be carried out irradiating a laser after obtaining the amorphous silicon film by baking.

Step of Forming the Insulating Film

Figure 2F:
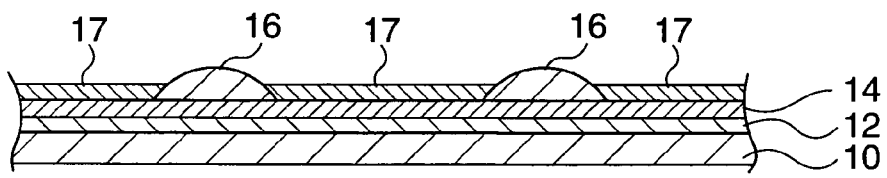

Next, as shown in FIG. 2F, the gap in between the I type semiconductor layers 16 that are arranged in an island shape is filled with the insulating film 17. The type of the insulating film 17 is not restricted in particular, and $SiO_2$ film or the like can be used. As for the forming method, a general sputtering method, CVD method or the like can be used. Because the feature of the manufacturing method of the photoelectric transducer concerning the invention exists in forming the I type semiconductor layer using a liquid material without requiring a vacuum process, all the steps can be carried out under the same equipments and environment by unifying the methods for other thin film into the method of using a liquid material. Therefore, the insulating film 17 can be formed, for example, by applying poly silazane only to the regions in between the islands with an ink-jet method, and baking this in the atmosphere, thereby making the $SiO_2$ film. Alternatively, the above-described liquid containing an silicon compound may be applied and baked in the atmosphere.

With the insulating film 17, the P type semiconductor layer 14 can be prevented from jointing to the N type semiconductor layer that is to be formed subsequently.

Step of Forming the N Type Semiconductor Layer and the Second Electrode

Figure 2G:
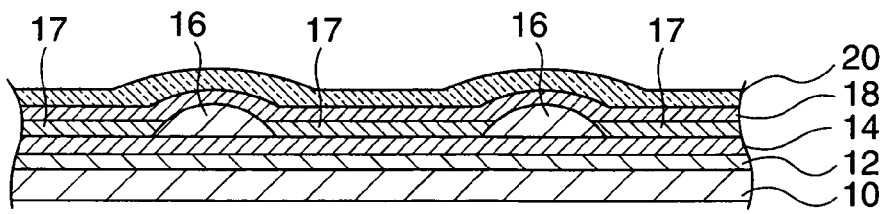

Next, as shown in FIG. 2G, the N type semiconductor layer 18 and the second electrode 20 are formed. The N type semiconductor layer 18 can be formed using a compound containing phosphorus in place of the compound containing boron in the above-described forming method of the P type semiconductor layer 14. The compound containing such phosphorus includes, for example, phosphine [$PH_3$], diphosphine [$P_2H_4$], trimethyl phosphine [$P(CH_3)_3$], triethyl phosphine [$P(C_2H_5)_3$], triphenyl phosphine [$P(C_6H_5)_3$], yellow phosphorus [$P_4$], or the like, other than the modified silane compound containing phosphorus.

Specifically, 1 mg of yellow phosphorus and 1 g of cyclopentasilane are dissolved in a mixed solvent of toluene 10 g and decalin 10 g thereby to prepare an coating solution, which is spin-coated in an argon atmosphere and is dried at 150° C., and thereafter if a thermal decomposition is carried out at 450° C. in argon that contains 3% hydrogen, then the N type semiconductor layer 18 with the film thicknesses of approximately 60 nm can be formed.

Finally, a liquid material of an organic compound that contains indium and tin is applied, and heat treatment is carried out to convert into ITO film, thereby making the second electrode 20.

Second Embodiment

This embodiment features that after forming the island-like silicon film as the I type semiconductor layer, droplets containing a silicon compound are arranged offsetting the center thereof relative to that of the already-formed silicon film, thereby forming a thicker I type semiconductor layer.

Figure 4A:
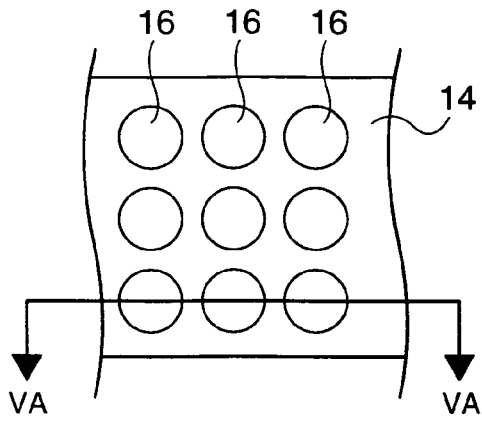
FIG. 4 shows explanatory views showing a second embodiment of the photoelectric transducer concerning the invention.
Figure 5A:
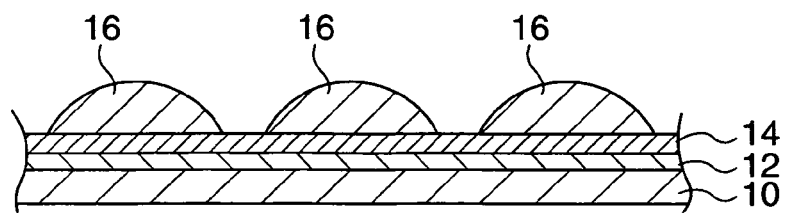
FIG. 5 shows sectional views along the VA through VA line to VD through VD line of FIG. 4.

After having proceeded to the step of forming the first electrode, the step of forming the P type semiconductor layer, the step of forming the liquid-repellent film, the step of forming the precursor film of the silicon film, and the heat treatment step, a silicon film, which is the I type semiconductor layer, is formed in an island shape. In FIG. 4A, there is shown a part of the plane view in the state in which the island-like silicon film is formed, and a sectional view along the VA through VA line in the view is shown in FIG. 5A.

Step of Forming the Liquid-Repellent Film: A Second Time

Figure 4B:
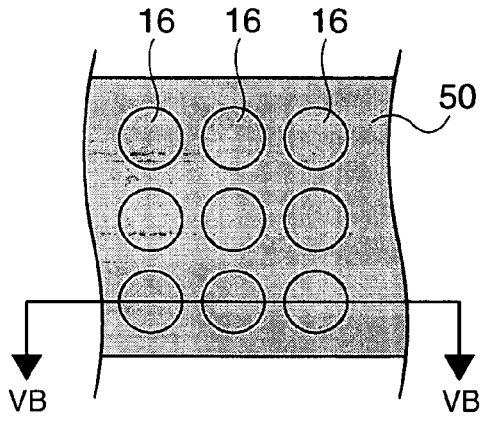
Figure 5B:
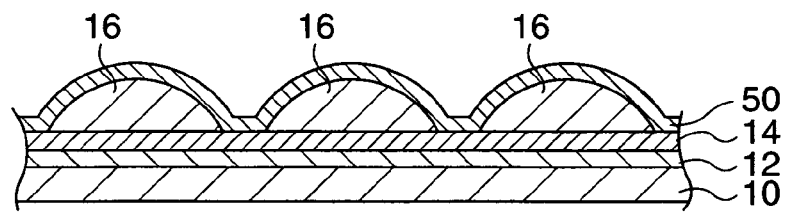

Then, as shown in FIG. 4B, and FIG. 5B which is a sectional view along the VB-VB line of FIG. 4B, a liquid-repellent film 50 is formed as to cover the whole P type semiconductor layer 14 and I type semiconductor layer 16. Since the forming method of the liquid-repellent film is as described above, the description thereof is omitted here.

Step of Forming the I Type Semiconductor Layer: A Second Time

Figure 4C:
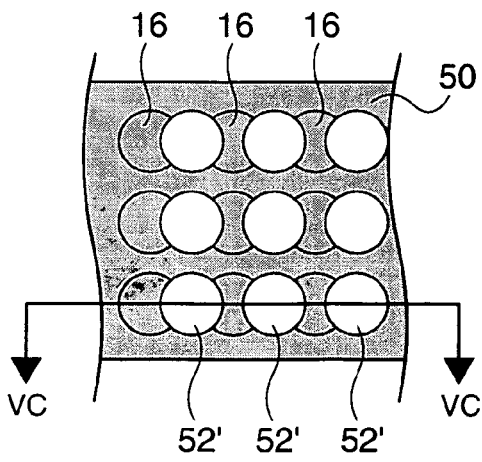
Figure 5C:
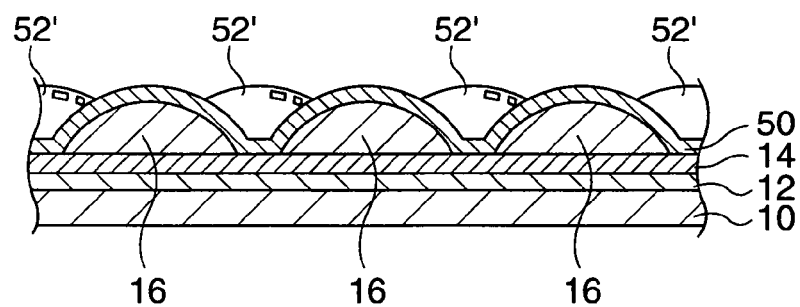

Next, in the equipment of FIG. 3, the droplet-discharging head 38 and table 32 are moved a little from the position where the precursor film of the I type semiconductor layer 16 is formed in a grid shape, and the droplets containing a silicon compound are discharged and arranged. In FIG. 4C, there is shown the state in which a precursor film 52' of the silicon film is formed by drying after the arrangement. Because of the arrangement on the liquid-repellent film 50, a precursor film having a micron-order film thickness can be formed with the surface tension of the droplet. The sectional view along the VC through VC line of FIG. 4C is shown in FIG. 5C.

Figure 4D:
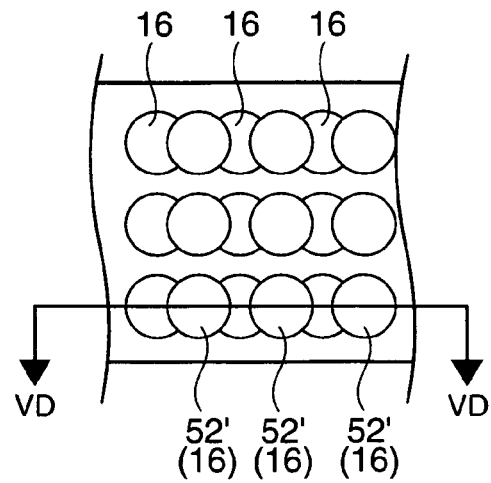
Figure 5D:
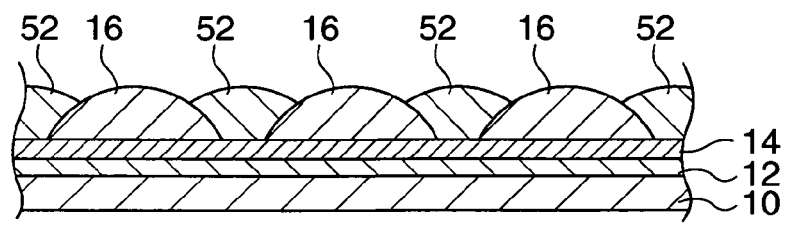

Then, as shown in FIG. 4D, a heating step or a photoirradiation step is carried out thereby to form the I type silicon film 52. The heating step and photoirradiation step can be carried out in the same way as the method in the first embodiment. The liquid-repellent film is decomposed and removed with the heat treatment, and the I type silicon film 16 and 52 will function as a unit. The plane view of this state is shown in FIG. 4D, and the sectional view along the VD-VD line of FIG. 4D is shown in FIG. 5D.

Figure 4E:
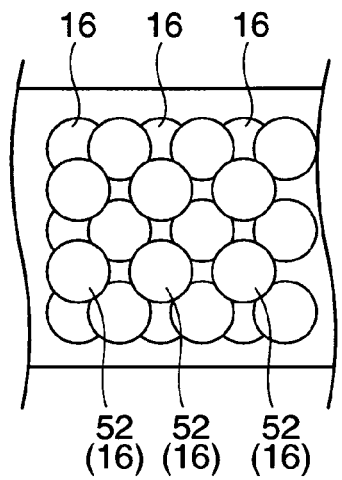

Step of Forming the Liquid-Repellent Film, and the Forming of the I Type Semiconductor Layer: A Third Time Furthermore, a liquid-repellent film is formed again as to cover the whole. This description is omitted because the step thereof is the same as the step of forming the liquid-repellent film in the second time. Then, the droplet-discharging head 38 and table 32 are moved a little further to discharge and arrange the droplets containing a silicon compound in the same way as the second step of forming the I type semiconductor layer. That the precursor of silicon film is formed by drying after the arrangement, and through the heating step and photoirradiation step, the precursor film is united with the I type silicon film that has been formed by this time, is the same as the second time. This state is shown in FIG. 4E.

Figure 4F:
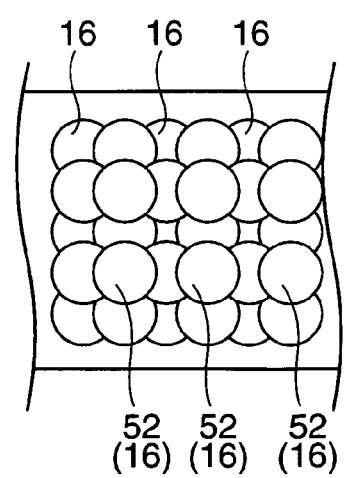

Step of Forming the Liquid-Repellent Film, and the Forming of the I Type Semiconductor Layer: A Fourth Time The liquid-repellent film is formed again as to cover the whole in the same way as the third time. In the same way as the third time, the head and table are moved a little to carry out discharging, drying, heating, and photo-irradiating, thereby forming the I type silicon film, which is united with the I type silicon film that has been formed by this time. This state is shown in FIG. 4F. Thus, according to this embodiment, a sufficiently thick I type semiconductor layer suitable for solar batteries can be formed in the whole surface of the P type semiconductor layer 14 with the method using the liquid material. Moreover, further thicker I type semiconductor layers can be manufactured by forming the silicon film in layers repeatedly further with a simple step.

After the formation of the silicon film, in accordance with the method described in the first embodiment, the N type semiconductor layer and second electrode are formed, thereby producing the photoelectric transducer 1.

Electronic Apparatus

The electronic apparatus of the invention is provided with such a photoelectric transducer 1. Hereinafter, the electronic apparatus of the invention is described based on FIG. 6 and FIG. 7.

Figure 6:
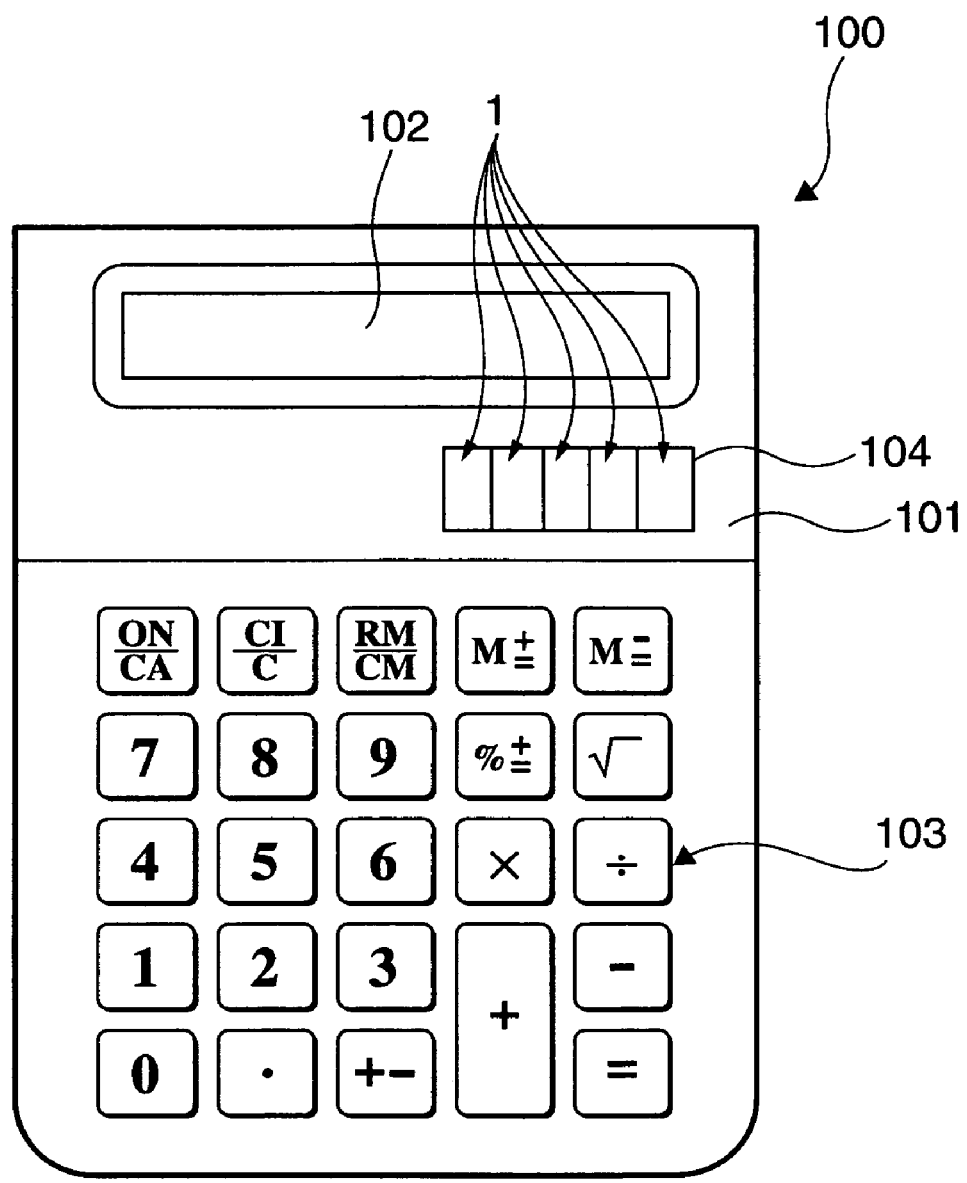
FIG. 6 shows an example of the electronic apparatus concerning the invention.
Figure 7:
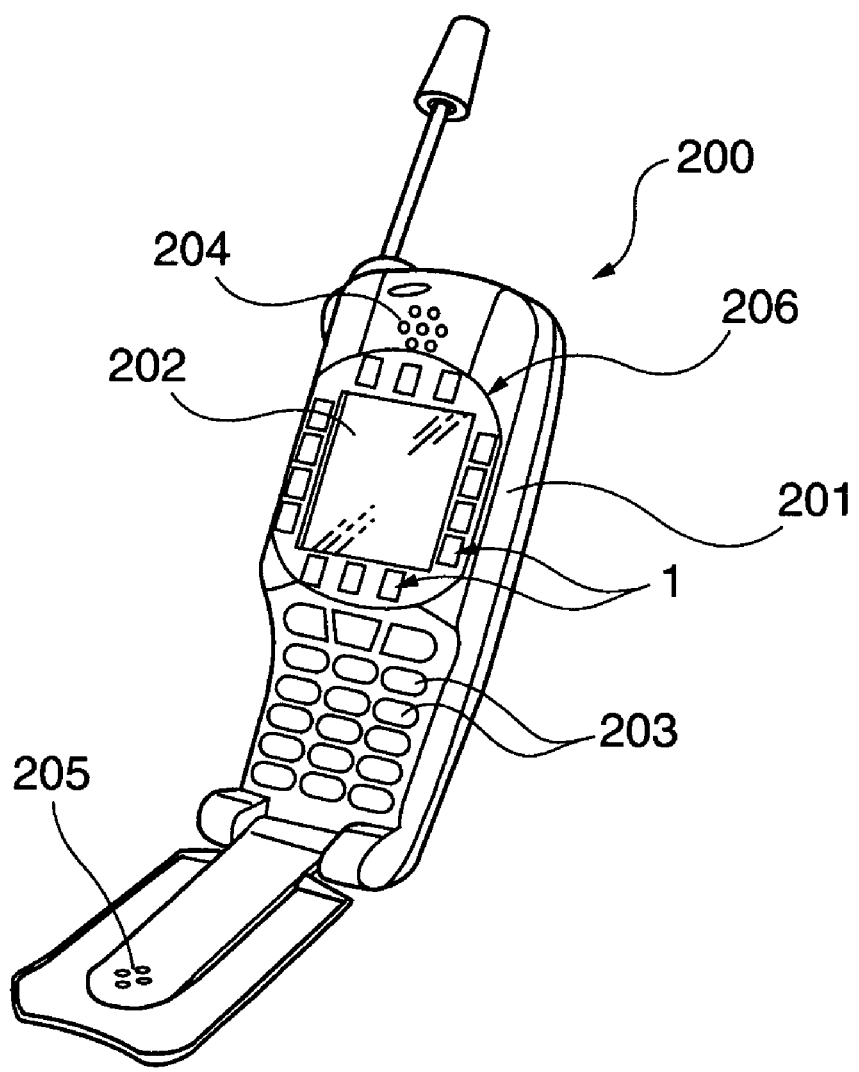
FIG. 7 shows an example of electronic apparatus concerning the invention.

FIG. 6 is a plane view showing a calculator to which the electronic apparatus of the invention is applied, and FIG. 7 is a perspective view showing a portable telephone (PHS is also included) to which the electronic apparatus of the invention is applied. The calculator 100 shown in FIG. 6 is provided with a body portion 101, and a display portion 102 prepared in the top face (front face) of the body portion 101, a plurality of operation buttons 103, and a photoelectric-transducer installation portion 104. In the configuration shown in FIG. 6, five photoelectric transducers 1 are coupled in series and arranged in the photoelectric-transducer installation portion 104.

The portable telephone 200 shown in FIG. 7 is provided with a body portion 201, and a display portion 202 prepared in the front face of the body portion 201, a plurality of operation buttons 203, an ear piece 204, a speaker 205 and a photoelectric-transducer installation portion 206. In the configuration shown in FIG. 7, the photoelectric-transducer installation portion 206 is prepared as to surround the periphery of the display 202, and a plurality of photoelectric transducers 1 are coupled in series and arranged. In addition, for the electronic apparatus of the invention, the invention can be applicable to, for example, photo sensors, optical switches, electronic notebooks, electronic dictionaries, wrist watches, clocks, or the like, other than the calculator shown in FIG. 6 and the portable telephone shown in FIG. 7.

As mentioned above, each of the illustrated embodiments has been described concerning the method for manufacturing the photoelectric transducer of the invention, the photoelectric transducer, and the electronic apparatus, however, the invention is not limited thereto, and the configuration of each part can be replaced with any configuration which exhibits the same function. Moreover, in the photoelectric transducer of the invention, other configurations (e.g., one layer or more in between the respective layers for any purpose) may be added.

What is claimed is:

1. A method of manufacturing a photoelectric transducer that includes a first electrode, a second electrode, a first conductivity-type semiconductor layer positioned between the first and second electrodes, a second conductivity-type semiconductor layer positioned between the first and second electrodes, an I type semiconductor layer positioned between the first and second conductivity-type semiconductor layers, the I type semiconductor layer including a plurality of I type semiconductor films, the method comprising:

forming a first liquid-repellant film on the first conductivity- type semiconductor layer;

forming a plurality of first liquid silicon material regions on the first liquid-repellant film by an ink jet method, each of the plurality of first liquid silicon material regions being formed such that it does not contact any other first liquid silicon material region on the first liquid-repellant film; and converting the plurality of first liquid silicon material regions into a plurality of first I type semiconductor films by carrying out heat treatment or photoirradiation treatment to the precursor film, so that each of the plurality of first I type semiconductor films having a thickness greater than 1 μm.

2. A method of manufacturing a photoelectric transducer according to claim 1, further comprising:

forming a second liquid-repellent film covering the plurality of I type semiconductor;

forming a plurality of second liquid silicon material regions on the second liquid- repellant film by an inkjet method, the plurality of second liquid silicon material regions being positioned on a plurality of spaces between the plurality of first I type semiconductor films, the plurality of second liquid silicon material regions being separated from each other; and converting the plurality of second liquid material regions into a plurality of second I type semiconductor films, the plurality of second I type semiconductor films being included in the I type semiconductor layer.

3. The method of manufacturing a photoelectric transducer according to claim 2, further comprising heating the first and second liquid-repellent films to decompose and remove the first and second liquid-repellent films.

4. The method of manufacturing a photoelectric transducer according to claim 1, a contact angle relative to the first liquid-repellant film and the plurality of liquid silicon material regions being within the range of 40 through 120 degrees during the process of discharging the plurality of first liquid silicon material regions.

5. The method of manufacturing a photoelectric transducer according to claim 1, further comprising:

forming an insulating film on a space between the plurality of first I type semiconductor films, the insulating film being positioned between the first and second conductivity-type semiconductor layers.

6. The method of manufacturing a photoelectric transducer according to claim 1, the plurality of first liquid silicon material regions including a liquid silicon compound having a ring system that is expressed with the general formula $Si_nX_m$, wherein X denotes a hydrogen atom and halogen atom, n denotes an integer of five or more, and m denotes an integer of n, 2n-2, or 2n.

7. A method for manufacturing a photoelectric transducer that includes a first electrode, a second electrode, a first conductivity-type semiconductor layer positioned between the first and second electrodes, a second conductivity-type semiconductor layer positioned between the first and second electrodes, an I type semiconductor layer positioned between the first and second conductivity-type semiconductor layers, the I type semiconductor layer including a plurality of I type semiconductor films, the method comprising:

forming a plurality of first liquid silicon material regions on the first conductivity-type semiconductor layer by an inkjet method, each of the plurality of first liquid silicon material regions being formed such that it does not contact any other first liquid silicon material region on the first conductivity-type semiconductor layer;

converting the plurality of first liquid silicon material regions into a plurality of first I type semiconductor films, so that each of the plurality of first I type semiconductor films has a thickness greater than 1 μm;

forming a plurality of second liquid silicon material regions by inkjet method, the plurality of second liquid silicon material regions being positioned on a plurality of spaces between the plurality of first I type semiconductor films, the plurality of second liquid silicon material regions being separated from each other; and converting the plurality of second liquid silicon material regions into a plurality of second I type semiconductor films, the plurality of second I type semiconductor films being included in the I type semiconductor layer.

8. The method of manufacturing a photoelectric transducer according to claim 7, the plurality of first liquid silicon material regions including a liquid silicon compound having a ring system that is expressed with the general formula $Si_nX_m$, wherein X denotes a hydrogen atom and halogen atom, n denotes an integer of five or more, and m denotes an integer of n, 2n-2, or 2n.

9. A method of manufacturing a photoelectric transducer that includes a first electrode, a second electrode, a first conductivity-type semiconductor layer positioned between the first and second electrodes, a second conductivity-type semiconductor layer positioned between the first and second electrodes, an I type semiconductor layer positioned between the first and second conductivity-type semiconductor layers, the I type semiconductor layer including a plurality of I type semiconductor films, the method comprising:

forming a plurality of first liquid silicon material regions on the first conductivity-type semiconductor layer by an inkjet method, each of the plurality of first liquid silicon material regions being formed such that it does not contact any other first liquid silicon material region on the first conductivity-type semiconductor layer; and converting the plurality of first liquid silicon material regions into a plurality of first I type semiconductor films, so that each of the plurality of first I type semiconductor films has a thickness greater than 1 μm; and forming an insulating film between the plurality of first I type semiconductor films, the insulating film being positioned between the first and second conductivity-type semiconductor layers.

10. The method of manufacturing a photoelectric transducer according to claim 9, the plurality of first liquid silicon material regions including a liquid silicon compound having a ring system that is expressed with the general formula $Si_nX_m$, wherein X denotes a hydrogen atom and halogen atom, n denotes an integer of five or more, and m denotes an integer of n, 2n-2, or 2n.

11. The method of manufacturing a photoelectric transducer according to claim 1, the plurality of first I type semiconductor films being a plurality of amorphous silicon films.

12. The method of manufacturing a photoelectric transducer according to claim 1, each of the plurality of first I type semiconductor films having a thickness greater than 2 μm.

13. The method of manufacturing a photoelectric transducer according to claim 1, each of the plurality of first I type semiconductor films having a thickness greater than 3 μm.

* * * * *